(12) United States Patent
Funakoshi

(10) Patent No.: US 6,598,114 B2
(45) Date of Patent: Jul. 22, 2003

(54) ELECTRONIC CONTROL UNIT INCLUDING FLASH MEMORY AND METHOD AND APPARATUS FOR STORING CONTROL DATA GROUP INTO FLASH MEMORY

(75) Inventor: Hiroshi Funakoshi, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 162 days.

(21) Appl. No.: 09/927,352

(22) Filed: Aug. 13, 2001

(65) Prior Publication Data

US 2002/0029313 A1 Mar. 7, 2002

(30) Foreign Application Priority Data

Sep. 7, 2000 (JP) .......................... 2000-270855

(51) Int. Cl.$^7$ ............................................. G06R 12/00
(52) U.S. Cl. .................. 711/103; 711/170; 711/172; 711/173; 365/185.29; 365/185.33; 701/115; 717/168
(58) Field of Search ................................. 711/103, 170, 711/172–173; 365/185.29, 185.33; 701/115; 717/168

(56) References Cited

U.S. PATENT DOCUMENTS

| | | | |
|---|---|---|---|
| 5,572,466 A | 11/1996 | Sukegawa | .............. 365/185.33 |
| 5,577,194 A * | 11/1996 | Wells et al. | .................... 714/8 |
| 5,809,558 A * | 9/1998 | Matthews et al. | .......... 711/173 |
| 5,828,977 A | 10/1998 | Hayashi et al. | ............. 701/115 |
| 6,046,937 A | 4/2000 | Komori et al. | ........ 365/185.04 |
| 6,226,728 B1 * | 5/2001 | See et al. | .................... 711/171 |

FOREIGN PATENT DOCUMENTS

JP 2000-45858 2/2000

* cited by examiner

Primary Examiner—Reginald G. Bragdon
Assistant Examiner—Mehdi Namazi
(74) Attorney, Agent, or Firm—Foley & Lardner

(57) ABSTRACT

In method and apparatus for storing a control data group in a flash memory and an electronic control unit, one memory block of the flash memory is provided for a storage of the control data group and a plurality of storage regions (A1 through A16) are allocated to the memory block in an order of addresses in such a manner that each storage region has a capacity enough for the control data group to be written thereinto, the control data group is written into one of the storage regions which is data-unwritten and whose address is top in the order of addresses, and at least one updated control data is written into one of the remaining storage regions which is data-unwritten and whose address is top in the order of addresses from among the remaining data-unwritten storage regions each time an update request to update the contents thereof occurs.

49 Claims, 5 Drawing Sheets

FIG.3A
PRIOR TO UPDATING

A1 (0000h):
- 00h (WRITTEN)
- ADJNSET
- ADJADV
- ⋮
- CVN

→ READ

A2 (0080h):
- FFh (UNWRITTEN)

A3 (0100h):
- FFh (UNWRITTEN)

A4 (0180h):
- FFh (UNWRITTEN)

FIG.3B
POST UPDATING

A1:
- 00h (WRITTEN)
- ADJNSET
- ADJADV
- ⋮
- CVN

A2:
- 00h (WRITTEN)
- ADJNSET *
- ADJADV
- ⋮
- CVN *

→ WRITE

A3:
- FFh (UNWRITTEN)

A4:
- FFh (UNWRITTEN)

ELECTRONIC CONTROL UNIT INCLUDING FLASH MEMORY AND METHOD AND APPARATUS FOR STORING CONTROL DATA GROUP INTO FLASH MEMORY

BACKGROUND OF THE INVENTION

1. Field of the Invention

The present invention relates to an electronic control unit (for example, an in-vehicle microcomputer) including flash memory as a ready-only memory (ROM) and method and apparatus for storing a control data group including control data specific to a control for a controlled system of the electronic control unit into the same flash memory.

2. Description of the Related Art

In general, in an automotive vehicle, such a microcomputer as described above has been used to control an engine and a drive train including an automatic transmission. Control data for the control of the controlled system are stored in a nonvolatile memory (read-only memory, i.e., ROM) in order to prevent he stored control data from being erased even if an electric power is turned off (a battery is disconnected from a power line of the microcomputer). A rewrite of the contents of the control data in the microcomputer is demanded at a stage of vehicle development or at a marketplace (viz., car dealer) in a case where the control contents in the microcomputer is needed to be altered.

Therefore, a rewritable nonvolatile memory is used in the in-vehicle microcomputer and an external memory rewritable device (an off-board (or an out-vehicle) electronic diagnosing tester such as a Consult) is connected to the in-vehicle microcomputer via communication medium and device to rewrite the contents of the rewritable nonvolatile memory. The writable nonvolatile memory includes an EEPROM (Electrically Erasable Programmable Read-Only Memory); and a flash memory (FLASH EEPROM).

The EEPROM is extremely expensive and its internal circuit structure is complex although the EEPROM can be erased and rewritten in a unit of one word (two bytes) and number of times the rewriting can be guaranteed is as many as one million number of times or more.

On the other hand, the flash memory (FLASH EEPROM) is inexpensive. However, although the flash memory can be written in the unit of one byte, it is necessary to perform an erasure of the contents thereof in a case of the rewrite in the unit of one block (for example, 2 kilobytes or 4 kilobytes). The number of times the rewrite can be guaranteed reach to approximately one hundred number of times.

To cope with such an inconvenience as described above, in a technique disclosed in a U.S. Pat. No. 6,046,937 to Komori et al, issued on Apr. 4, 2000 (which corresponds to a Japanese Patent Application First Publication No. Heisei 2000-45858 published on Feb. 15, 2000), a count information storage region for retaining the write count of the flash memory is set up at a plurality of consecutive addresses in the flash memory, each time rewriting process is carried out by a CPU of the microcomputer for the flash memory, data-unwritten address in the count information storage region is selected in ascending order of addresses starting from the top address thereof, and numeric value data representing a rewrite count of the flash memory is written to the address thus selected in order for the number of times the rewrite processes of the flash memory to be easily determined and to be accurately determined even if such a bit garbling that any bit data is erroneously changed from "0" to "1" or vice versa occurs.

Both of the flash memory and the EEPROM have previously been installed in the in-vehicle microcomputer and have been shared in use for different purposes according to respective features of the flash memory and EEPROM with the above-described inherent characteristics of these nonvolatile read-only memories in mind.

That is to say, programs and a calibration verification value to diagnose ROM (CVN) allocated to the flash memory. In addition, various kinds of adjustment values (an idling speed adjustment value, ignition timing adjustment value, and so forth), freeze frame data (FFD) to store and retain drive data before and after a failure occurrence, and so forth are allocated to the EEPROM which is easy to update the contents thereof.

SUMMARY OF THE INVENTION

However, in spite of the fact that each of the EEPROM and the flash memory is electrically rewritable, both readonly memories have previously been installed in the in-vehicle microcomputer so that a system cost of the microcomputer accordingly becomes high.

Our inventors have discussed an abolishment of the installation of the expensive EEPROM and a possibility of a single use of the flash memory only as the ROM of the in-vehicle microcomputer.

As a result of the discussion, our inventors have reached to such a conclusion as described below. That is to say, from among the data previously allocated to the EEPROM, it is possible to move the freeze frame data (FFD) into a back-up RAM and the remaining data (idling speed adjustment value, ignition timing adjustment value, immobilizer encryption key, and so forth) can be allocated to the flash memory if a method of writing (or a method of updating) is devised.

It is, with the above-described conclusion in mind, an object of the present invention to provide an inexpensive electronic control unit including a flash memory (FLASH EEPROM) as a rewritable nonvolatile read-only memory and method and apparatus for storing the control data in the flash memory of the electronic control unit which can achieve a storage of specific control data group including at least one control data requiring rewrite of contents thereof into the flash memory.

According to one aspect of the present invention, there is provided with a method for storing a control data group, the control data group including control data specific to a control for a controlled system, into a flash memory (3) used for a read-only memory of an electronic control unit (1), the method comprising:providing (FIG. 2) a predetermined memory block of the flash memory for a storage of the control data group, the control data group including at least one control data requiring an update of contents thereof and at least one updated control data; and allocating (FIG. 2) a plurality of storage regions (A1 through A16) to the predetermined memory block of the flash memory in an order of addresses in such a manner that each storage region has a capacity enough for the control data group to be written thereinto, the control data group including the control data requiring the update of the contents thereof is written into one of the storage regions which is data-unwritten and whose address is top in the order of addresses, and at least the updated control data is written into one of the remaining storage regions which is data-unwritten and whose address is top in the order of addresses from among the remaining data-unwritten storage regions each time an update request to update the contents of the control data occurs.

According to another aspect of the present invention, there is provided with A method for storing a control data group, the control data group including control data specific to a control for a controlled system, into a flash memory (3) used for a read-only memory of an electronic control unit (1), the method comprising: allocating (FIG. 2) a plurality of storage regions (A1 through A16), each of the storage regions having a capacity enough for the control data group including at least one control data requiring an update of contents thereof and at least one updated control data to be written thereinto, to the predetermined memory block of the flash memory in an order of addresses; writing (FIG. 2) the control data group including the one control data requiring the update of the contents thereof into one of the storage regions which is date-unwritten and whose address is top in the order of addresses; and writing (FIG. 3B, FIG. 4B) at least the updated control data into one of the remaining storage regions which is data-unwritten and whose address is top in the order of addresses from among the remaining data-unwritten storage regions each time an update request to update the content of thereof occurs.

According to a still another aspect of the present invention, there is provided with an apparatus for storing a control data group, the control data group including control data specific to a control for a controlled system, into a flash memory (3) used for a read-only memory of an electronic control unit (1), the apparatus comprising: storage region allocating section (FIG. 2) that allocates a plurality of storage regions (A1 through A16), each of the storage regions having a capacity enough for the control data group including at least one control data requiring an update of contents thereof and at least one updated control data to be written thereinto, to the predetermined memory block of the flash memory in an order of addresses; a control data group writing section (1, FIG. 2) that writes the control data group including the control data requiring the update of contents thereof into the one of the storage regions which is date-unwritten and whose address is top in the order of addresses; and an updated data write processing section (1, FIG. 3B, FIG. 4B) that writes at least the updated control data into one of the storage regions which is data-unwritten and whose address is top in the order of addresses from among the remaining data-unwritten storage regions each time the update request occurs.

According to a further aspect of the present invention, there is provided with An electronic control unit comprising: a flash memory (3) having a predetermined memory block to which a plurality of storage regions (A1 through A16) are allocated in an order of addresses, each of the storage regions having a capacity enough for a control data group including control data specific to a control for a controlled system to be written and the control data group including at least one control data requiring an update of contents thereof being written into one of the storage regions which is data-unwritten and whose address is top in the order of addresses; a first determinator (S7 in FIG. 5) to determine whether an update request to update the contents of the control data requiring the update is issued from a memory write device external to the electronic control unit; and an updated control data writing processor (1) to write at least the updated control data into one of the remaining storage regions which is data-unwritten and whose address is top in the order of addresses from among the remaining data-unwritten storage regions each time the determinator determines that the update request is issued.

This summary of the invention does not necessarily describe all necessary features so that the invention may also be a sub-combination of these described features.

DETAILED DESCRIPTION OF THE PREFERRED EMBODIMENTS

Reference will hereinafter be made to the drawings in order to facilitate a better understanding of the present invention.

Figure 1:
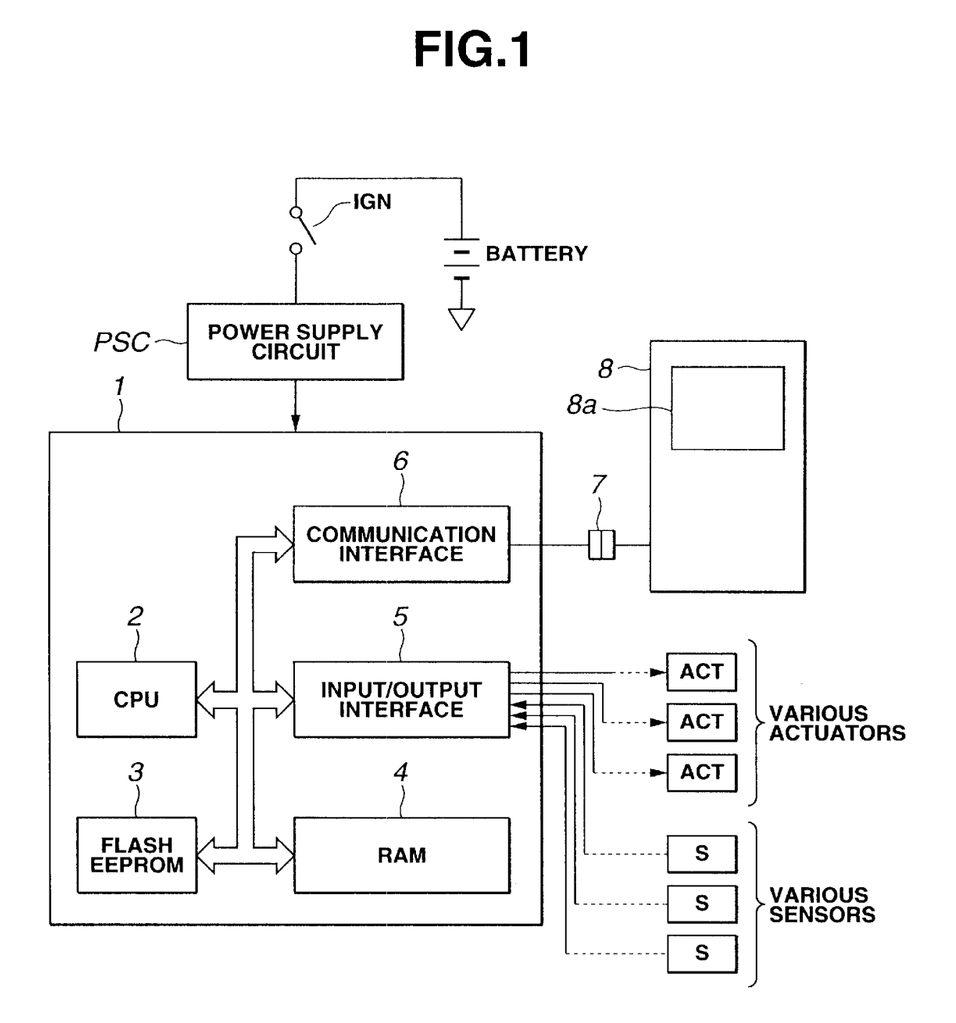
FIG. 1 is a system configuration view of an electronic control unit in a preferred embodiment according to the present invention.

FIG. 1 shows a system configuration of an electronic control unit (vehicular control purpose microcomputer) in a preferred embodiment according to the present invention.

In FIG. 1, an in-vehicle microcomputer 1 includes: a CPU (Central Processing Unit); a nonvolatile flash memory (FLASH EEPROM) 3 (hereinafter, referred simply as to a flash memory), a volatile RAM (Random Access Memory) 4, an Input/Output interface 5 to input and output signals to various sensors and from various actuators, a communication interface 6, and a common bus.

In addition, an external memory write device 8 (an electronic system diagnostic tester such as a Consult) is connectable to communication interface (I/F) 6 via a connector 7. A reference numeral 8a denotes a monitor display. It is noted that flash memory 3 is an electrically rewritable nonvolatile memory, has a memory capacity of, e.g., 12 kilobytes, and is designed to store data of one byte (8 bits) per address. It is also noted that the in-vehicle microcomputer 1 receives a power voltage (for example, 5 volts) from a power supply circuit PSC when an ignition switch IGN is turned to an on state so that the power supply circuit PSC receives a battery power of a vehicular battery BATTERY.

Figure 2:
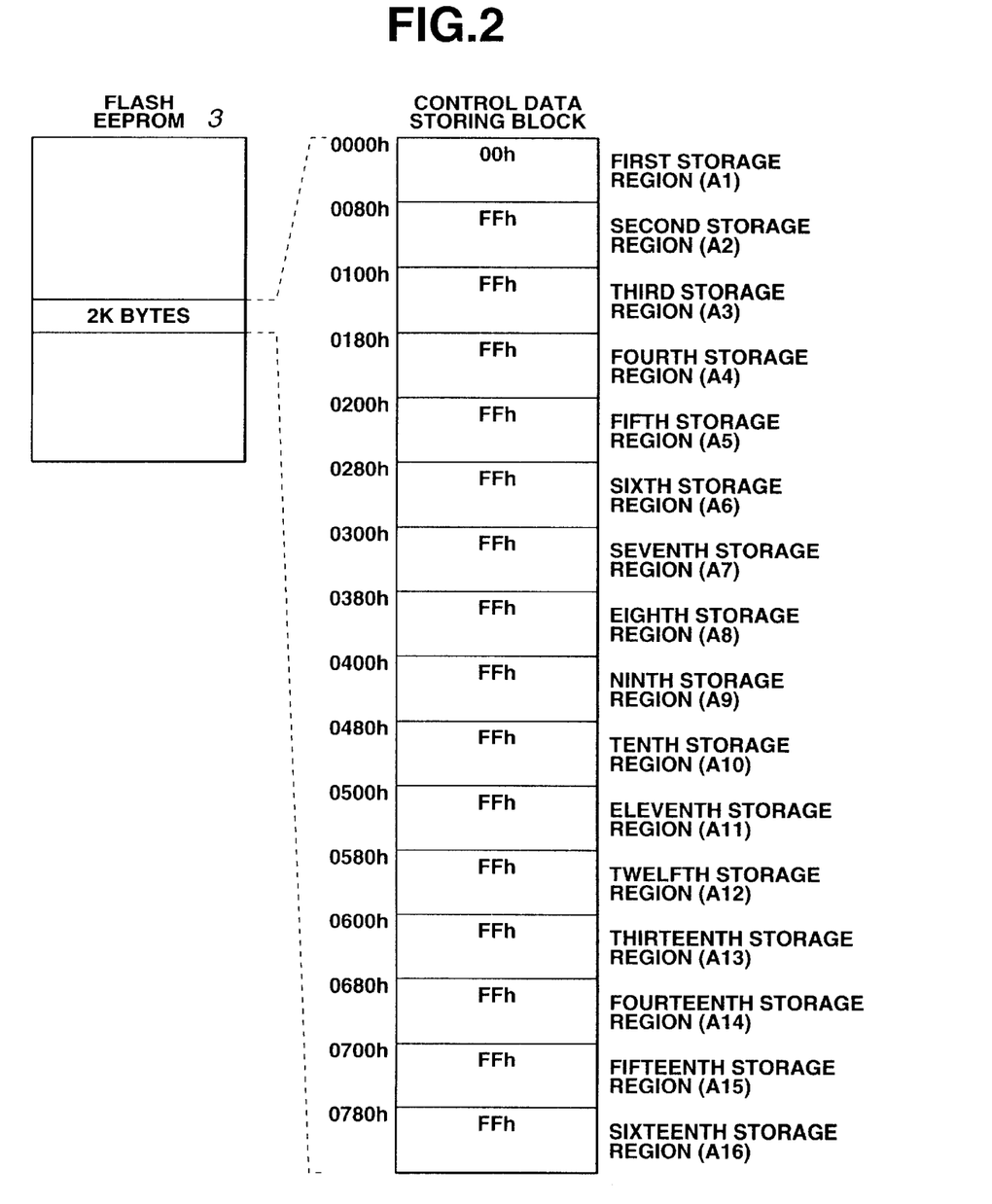
FIG. 2 is an diagrammatical view of a flash memory for explaining control data allocation in the flash memory of the electronic control unit shown in FIG. 1.

Referring to FIG. 2, control programs and control data are written into flash memory (also called, FLASH EEPROM) 3. A memory block for storing control data of, for example, 2 kilobytes is set up at predetermined address positions to store specific control data group needed to rewrite. A plurality of storage regions which have capacities capable of storing the specific control data group needed to rewrite are set within the memory block in an ascending order of addresses (A1 through A16). Each storage region A1 through A16 has a memory size of, for example, 128 bytes and sixteen storage regions (2048 (bytes)/128 (bytes)) are prepared within 2-kilobyte memory block. It is noted that addresses shown in FIG. 2 are relative addresses.

In the specific control data group, in addition to the idling speed adjustment value ADJNSET, ignition timing value adjustment value ADJADV, immobilizer encryption key, a calibration verification value (CVN) can be included. The CVN is a sum value and/or a parity value previously calculated form all data within the ROM in order to diagnose the ROM.

In addition, a top address (of two bytes) of each storage region A1 through A16 is provided with a memory location into which a discrimination data of two bytes representing an absence or presence of the rewrite into its corresponding storage region is stored. The memory location of the discrimination data indicates FFh (respective "1"'s for all bits and h is an abbreviation for a hexadecimal) when no rewrite of data thereinto occurs and indicates 00h (respective "0"'s for all bits) when the rewrite of data thereinto occurs.

Hence, in an example of FIG. 2, a first storage region A1 is written and a second storage region A2 and its subsequent storage regions A3 through A16 are unwritten.

FIGS. 3A, 3B, 4A, and 4B show patterns for control data within respective storage regions of control data storing blocks to be updated.

Figure 3A:
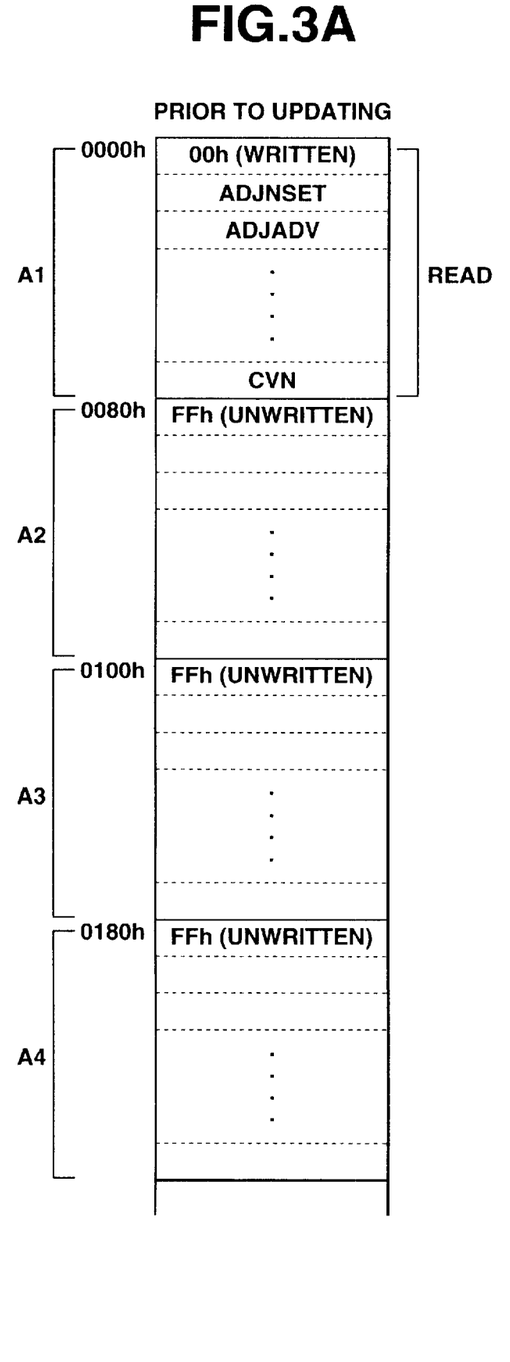
FIGS. 3A and 3B are diagrammatical views of the flash memory for explaining a pattern of the control data before and after update process in the flash memory of the electronic control unit shown in FIG. 1.

FIG. 3A shows the pattern of an initial state (prior to updating). In first storage region A1, specific control data group required to rewrite, for example, idling speed adjustment value ADJNSET, ignition timing adjustment value ADJADV (it is noted that in the initial state, the adjustment value is ordinarily 0 and no correction is made), and calibration verification value CVN is written. In addition, 00h is written into the discrimination data memory location of the top address of first storage region A1. On the other hand, in second storage region A2, and subsequent storage regions A3 through A16, no control data are unwritten since FFh are written into these top addresses, as shown in FIG. 2.

When the control data is used, control data (ADJNSET, ADJADV, - - - , CVN) are read and used from one of the plurality of regions A1 through A16 which is written according to 00h of the discrimination data and whose address is a last in an ascending address order.

When an update request is issued for at least one control data (for example, idling speed adjustment value ADJNSET) from among the specific control data group under a state shown in FIG. 3A, all specific control data including the control data to be updated (in this case, idling speed adjustment value ADJADV) and the control data not to be updated (ignition timing adjustment data ADJADV) are written into one of storage regions A1 through A16 which is unwritten according to the discrimination data of FFh and whose address is a top in the ascending order, viz., second storage address A2. At the same time, 00h indicating that the memory location region is written into the memory location of the discrimination data located at the top address of second storage region A2.

In addition, the sum value and/or parity value is written as CVN into a memory location, i.e., address portion allocated to calibration verification value CVN of second storage region A2 which is recalculated on the basis of all data within ROM (memory block of flash memory 3) after updating. Consequently, the memory contents in the memory block is changed to that shown in FIG. 3B. It is noted that, in FIG. 3B, the control data with a mark of * denotes an (once) updated data.

Figure 3B:
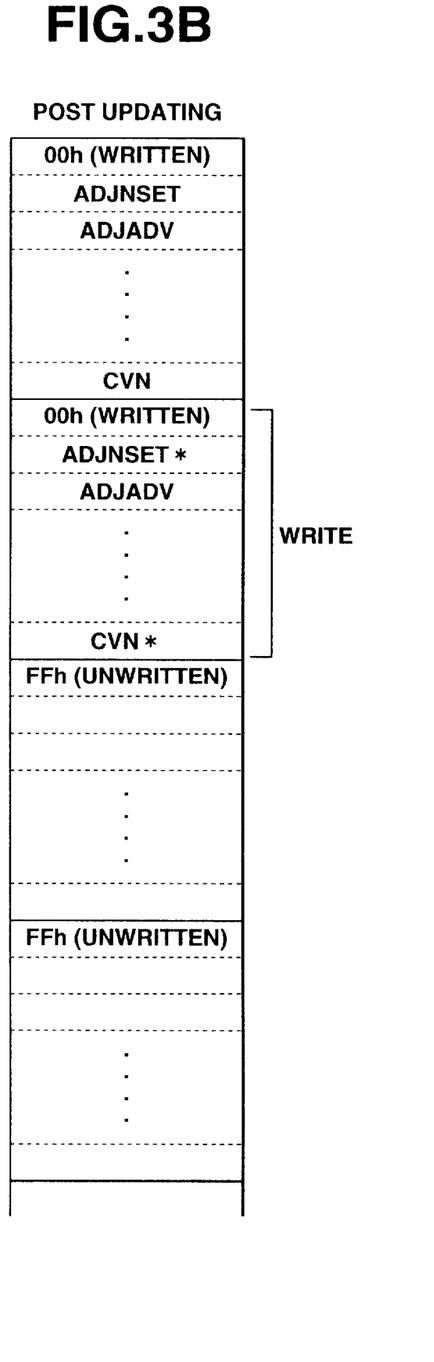

Thereafter, when the control data is used, control data (ADJNSET*, ADJADV, - - - , CVN*) are read and used from one of storage regions A1 through A16 which is written according to 00d of the discrimination data and whose address is the last in the ascending address order, in this case from second storage region A2.

Figure 4A:
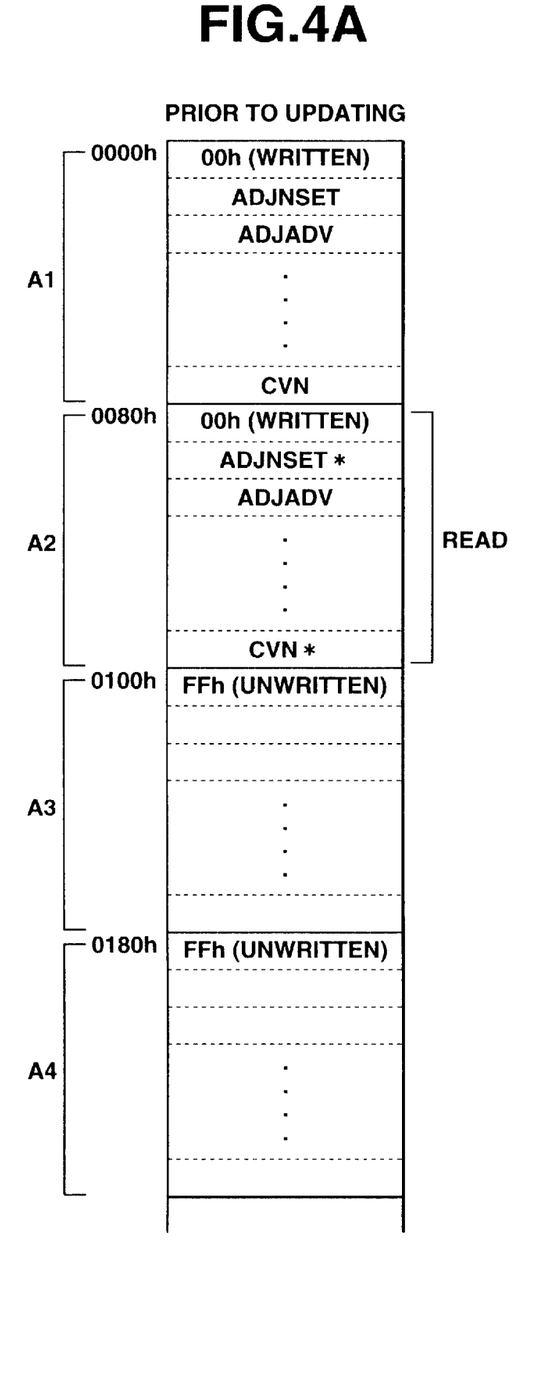
FIGS. 4A and 4B are diagrammatical views of the flash memory for explaining another pattern of the control data before and after the update process in the flash memory of the electronic control unit shown in FIG. 1.

When the update request is issued to update at least one control data (for example, ignition timing adjustment value ADJADV) from among the specific control data group under the state shown in FIG. 4A, all of the specific control data group including the control data to be updated (ignition timing adjustment value ADJADV) and the other control data not to be updated are written into one of storage regions A1 through A16 which is unwritten according to FFh of the discrimination data and whose address is the top in the ascending address order, viz., in this case, third storage region A3.

At the same time, 00h indicating that the storage region (in this case, third storage region A3) is written is written into the memory location of the discrimination data located at the top address of third storage region A3. In addition, the sum value and/or parity value which is recalculated on the basis of all data within the ROM after the updating process is written into a memory location (i.e., a corresponding address) of the calibration verification value (CVN) as CVN. Consequently, the pattern of the memory block in flash memory 3 is changed to that shown in FIG. 4B. It is noted that the control data with a mark of ** denotes a twice updated data.

Figure 4B:
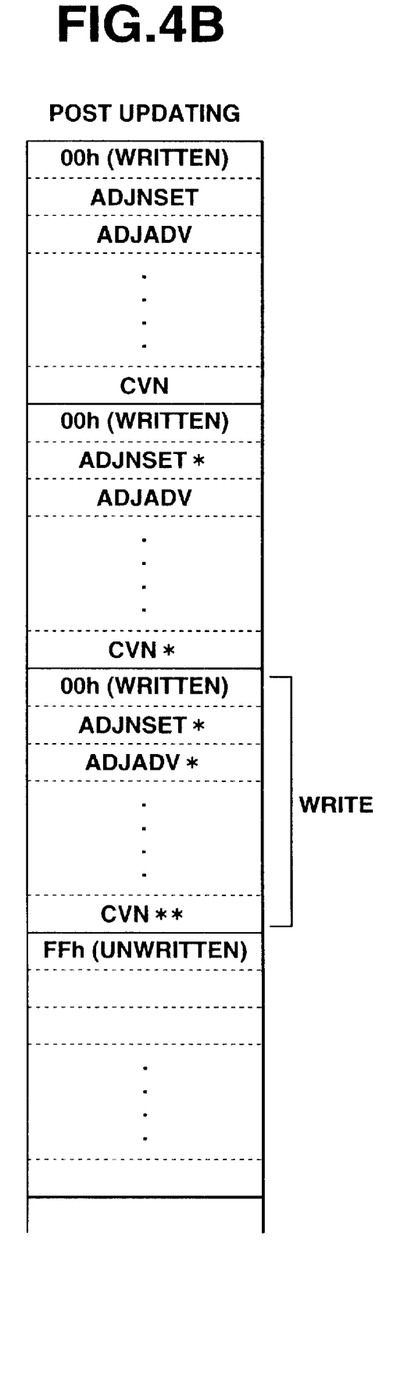

Thereafter, when the control data is used, the control data (ADJNSET*, ADJADV*, - - - , CVN**) are read and used from one of storage regions which is written according to 00h of the discrimination data and whose address is the last in the ascending address order, i.e., in this case, third storage region A3.

Figure 5:
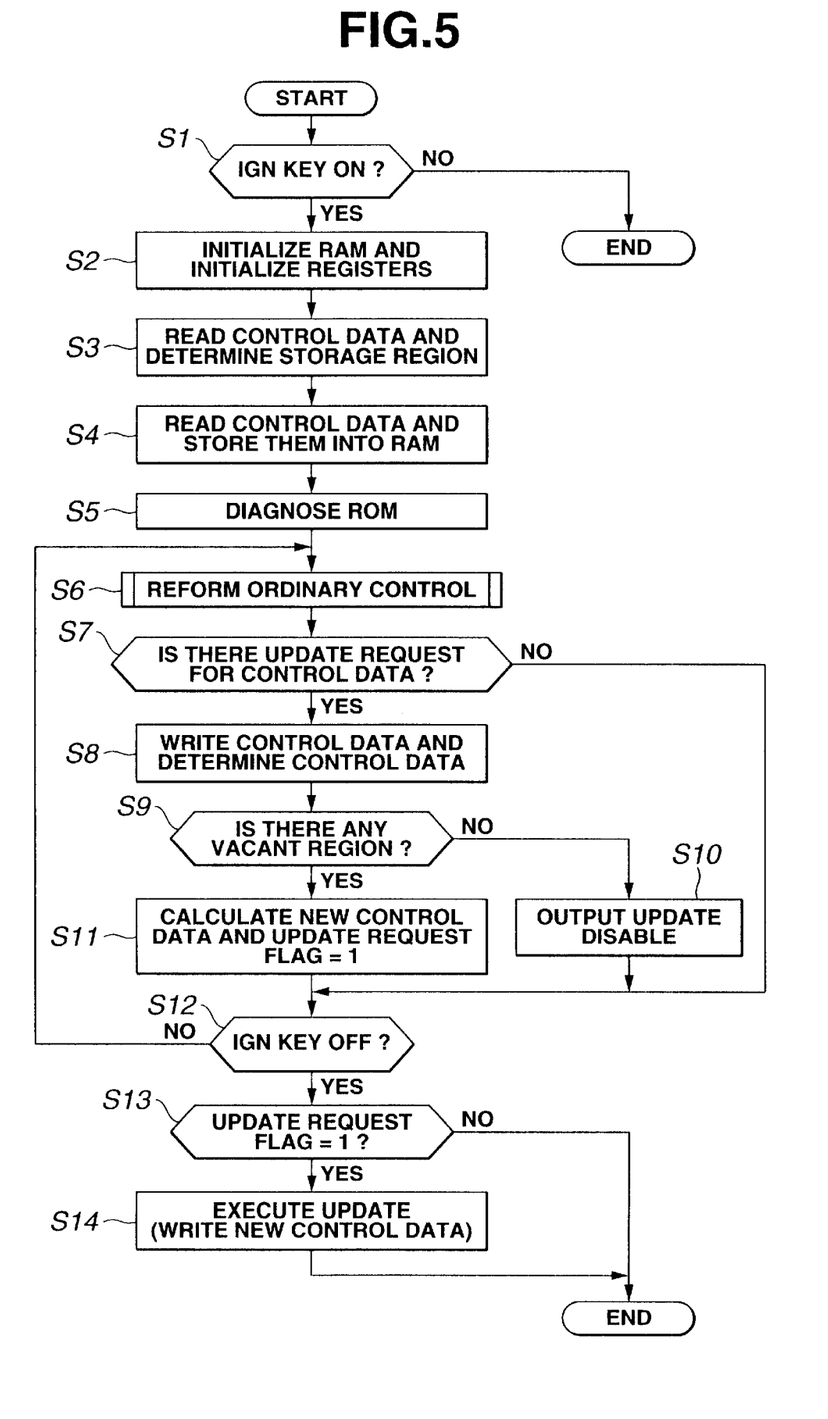
FIG. 5 is an operational flowchart representing a rewrite procedure for the flash memory of the electronic control unit shown in FIG. 1.

FIG. 5 shows a control flowchart executed in microcomputer 1 described above. It is noted that a program corresponding to the flowchart shown in FIG. 5 is stored in another memory block of flash memory 3.

At a step S1, microcomputer 1 determines if ignition key IGN is turned on. If Yes (IGN KEY ON) at step S1, the routine goes to a step S2.

At step S2, contents of RAM 4 and registers in CPU 2 are initialized as a well known process.

At a step S3, microcomputer 1 determines from which of the plurality of storage regions A1 through A16 the control data is read and into which of storage regions a latest write is carried out.

Specifically, the discrimination data is, at first, read from the top address of the control data storing memory block (viz., first storage region A1). Consequently, if the discrimination data indicates 00h, an address counter of CPU 2 is incremented by 80h and microcomputer 1 reads the discrimination data from the top address of the subsequent storage region (viz., second storage region A2).

As a result of this, if the discrimination data of second storage region A2 indicates FFh as in the example shown in FIG. 3A, microcomputer 1 determines that second storage region A2 is unwritten so that the descending previous first storage region A1 is the lastly written region and is the region to be read.

On the other hand, as shown in FIG. 4A, if the discrimination data of second storage region A2 indicates 00h, the address counter is furthermore incremented by 80h to read the discrimination data from the top address of the subsequent third storage region A3. If the discrimination data is FFh, the corresponding third storage region A3 is determined to be unwritten and the previous second storage region A2 is determined to be the latest written storage region and the region to be read.

At a step S4, microcomputer 1 reads control data (ADJNSET, ADJADV, - - - , CVN) form one of storage regions determined as the region to be read at step S3 and stores them into RAM 4. Steps S3 and S4 correspond to the control data reading means.

At a step S5, a diagnosis of ROM 3 is executed. In ROM diagnosis, sum value and/or parity value of all data within ROM (flash memory) 3 is calculated, the calculated sum value and/or parity value is compared with the CVN (an expectation value of the sum value and/or parity value) from among the control data read at step S4 to diagnose if they are coincident with each other. If they are coincident with each other, "ROM diagnosis OK " is outputted to inform the external rewrite device of a normal state of the contents of ROM" and the routine goes to step S6 in which the ordinary control is repeated. If they are not coincident with each other, "ROM diagnosis NG" is outputted and control is transferred to a fail safe mode (not shown).

At step S6, the ordinary control (for example, an engine parameter control) is executed. While the ordinary control is being executed, at a step S7, microcomputer 1 simultaneously determines if there is an update request for the control data. It is noted that the update request for the control data occurs when a predetermined operation is artificially coincident with the in-vehicle microcomputer 1 connected to an external rewrite device (electronic diagnostic tester) 8. It is also noted that the ordinary control at step S6 is continued unless the update request for the control data is issued and unless ignition key IGN is turned off at a step S12.

If there is the update request for control data at step S7, the routine goes to a step S8. At step S8, microcomputer 1 determines one of unwritten storage regions into which the control data is updated and newly written from among the plurality of storage regions A1 through A16 within the control memory block of flash memory 3. It is noted that this determination process serves to check to see if a vacant storage region is present with the control data storing memory block of flash memory 3.

Specifically, in the same manner as described above, CPU 2 reads the discrimination data from the top address of control data storing memory block (viz., first storage region A1). Hence, if the discrimination data indicates 00h, the address counter is incremented by 80h to read the discrimination data from the top address of the subsequent storage region (viz., second storage region A2).

Consequently, as in the example shown in FIG. 3B, if the discrimination data on second storage region A2 is FFh, second storage region A2 is determined to be unwritten and to be the region to be written.

In this case, $1/16$ of memory block is written and $15/16$ is unwritten. Such a vacant situation as described above is outputted to the external memory rewrite device 8 to inform an operator of the vacant situation through monitor display 8a of the external memory write device 8 as monitoring means (a monitor).

As shown in FIG. 4A, if the discrimination data of second storage region A2 indicates 00h, the address counter is furthermore incremented by 80h to read discrimination data from the top address of the subsequent third storage region A3. Consequently, if the discrimination data is FFh, the third storage region A3 is unwritten and to be the region to be written. In this case, $2/16$ are written but $14/16$ are unwritten. These vacant situation is outputted to the external memory rewrite device to inform the operator of the vacant situation through monitor display 8a.

At a step S9, microcomputer 1 determines whether the vacant storage region is present or absent according to the vacant situation. If the vacant storage region is not present (in a case where $16/16$ are written), the routine goes to a step S10. At a step S10, microcomputer 1 outputs such a message or signal that this update is disabled to the external memory rewrite device 8 to display the message through monitor display 8a. Thereafter, unless IGN KEY OFF is detected at step S12, the routine returns to the ordinary control at step S6.

At a step S11, CPU 2 calculates a new control data on the basis of the update request of the control data. For example, for an adjustment request of the idling speed, a new idling speed adjustment value ADJNSET is calculated. In addition, for an adjustment request of the ignition timing, a new ignition timing adjustment value ADJADV is calculated.

Then, in order to execute the update process after the ignition key IGN KEY is turned off, all of new control data group including the control data to be updated and the control data not to be updated are temporarily stored into RAM 4 at step S11. This new control data group includes the discrimination data of 00h indicating that the storage region is written. In addition, since the write of the new control data group through the update process requires the modification of calibration verification value CVN, a new CVN as the sum value and/or parity value based on the data within ROM (flash memory 3) in the case of a post update is calculated. This new CVN is included in the new control data group. Then, in order to instruct the execution of update after KEY OFF (ignition key is turned off), an update request flag is set to "1 ". Thereafter, the routine is returned to the ordinary control procedure at step S6 unless the ignition key OFF state is detected at a step S12.

If ignition key IGN is turned off at step S12 (Yes), the routine goes to a step S13. At step S13, microcomputer 1 determines if update request flag is set to "1". If update request flag=0 at step S13, the flow shown in FIG. 5 is ended. If update request flag=1 at step S13, the routine goes to a step S14.

At step S14, the update process is executed. That is to say, the new control data group temporarily stored in RAM 4 at step S11 is written into the storage region (second storage region A2 in the example of FIGS. 3A and 3B and third storage region A3 in the example shown in FIGS. 4A and 4B) determined as the storage region for the control data to be written and the routine is ended.

At this time, the memory location of discrimination data located at the top address of the storage region to be written is 00h indicating that the corresponding storage region is written. Steps S7, S8, S11, and S14 correspond to updated control data write processor (updated control data write processing section (means)).

It is noted that, although, in the preferred embodiment, the whole control data including the control data not updated is written into one of the remaining storage regions which is data-unwritten and whose address is top in the order of addresses from among the remaining data-unwritten storage regions (A2 through A16), only the updated control data may be written into the one of the remaining data-unwritten storage region described above.

It is also noted that although the memory location to store the discrimination data is located at the top address of each storage region, the top address of the storage regions at which the discrimination data is stored is different from the top address of the storage region to which the whole control data group including the updated control data is written.

The entire contents of a Japanese Patent Application No. 2000-270855 (filed in Japan on Sep. 7, 2000) are herein incorporated by reference. Although the invention has been described above by reference to certain embodiment of the invention, the invention is not limited to the embodiments described above. Modifications and variations of the embodiments described above will occur to those skilled in the art in the light of the above teachings. The scope of the invention is defined with reference to the following claims.

What is claimed is:

1. A method for storing a control data group, the control data group including control data specific to a control for a controlled system, into a flash memory used for a read-only memory of an electronic control unit, the method comprising:

providing a predetermined memory block of the flash memory for a storage of the control data group, the control data group including at least one control data requiring an update of contents thereof and at least one updated control data; and allocating a plurality of storage regions to the predetermined memory block of the flash memory in an order of addresses in such a manner that each storage region has a capacity enough for the control data group to be written thereinto, the control data group including the control data requiring the update of the contents thereof is written into one of the storage regions which is data-unwritten and whose address is top in the order of addresses, and at least the updated control data is written into one of the remaining storage regions which is data-unwritten and whose address is top in the order of addresses from among the remaining data-unwritten storage regions each time an update request to update the contents of the control data occurs.

2. A method for storing a control data group, the control data group including control data specific to a control for a controlled system, into a flash memory used for a read-only memory of an electronic control unit as claimed in claim 1, which further comprises; writing the control data group into one of the storage regions which is data-unwritten and whose address is top in the order of addresses; and writing the updated control data into one of the storage regions which is data-unwritten and whose address is top in the order of addresses from among the remaining data-unwritten storage regions when the update request occurs.

3. A method for storing a control data group, the control data group including control data specific to a control for a controlled system, into a flash memory used for a read-only memory of an electronic control unit as claimed in claim 2, wherein, when writing the updated control data into one of the remaining storage regions which is data-unwritten and whose address is top in the order of addresses from among the remaining data-unwritten storage regions, writing the whole control data group including the remaining control data not updated together with the updated control data into one of the remaining storage regions which is data-unwritten and whose address is top in the order of addresses from among the remaining data-unwritten storage regions each time the update request occurs.

4. A method for storing a control data group, the control data group including control data specific to a control for a controlled system, into a flash memory used for a read-only memory of an electronic control unit as claimed in claim 3, which further comprises reading the control data group from one of the storage regions which is data-written and whose address is last in the order of addresses from among the data-written storage regions during a use of the control data group.

5. A method for storing a control data group, the control data group including control data specific to a control for a controlled system, into a flash memory used for a read-only memory of an electronic control unit as claimed in claim 4, wherein, when allocating the plurality of storage regions to the predetermined memory block of the flash memory, providing a memory location for a discrimination data indicating whether the data is written or unwritten into the corresponding storage region for each of the storage regions and wherein, before reading the control data group from the one of the storage regions which is data written and whose address is last in the order of addresses from among the data-written storage regions, reading the discrimination data from the corresponding memory location to determine whether the storage region in which the read discrimination data is stored is the storage region from which the control data group is to be read.

6. A method for storing a control data group, the control data group including control data specific to a control for a controlled system, into a flash memory used for a read-only memory of an electronic control unit as claimed in claim 5, wherein, before writing the whole control data group including the updated control data and the remaining control data not updated into one of the storage regions which is data-unwritten and whose address is top in the order of addresses from among the remaining data-unwritten storage regions, reading the discrimination data from the corresponding memory location to determine whether the storage region in which the read discrimination data is stored is the storage region into which the control data group including the updated control data is to be written.

7. A method for storing a control data group, the control data group including control data specific to a control for a controlled system, into a flash memory used for a read-only memory of an electronic control unit as claimed in claim 6, wherein the control data group includes a calibration verification value to be calculated on the basis of all data within the flash memory to diagnose the flash memory and wherein, whenever the control data requiring the update of the contents thereof is updated, updating the calibration verification value is carried out.

8. A method for storing a control data group, the control data group including control data specific to a control for a controlled system, into a flash memory used for a read-only memory of an electronic control unit as claimed in claim 7, which further comprises searching the data-written storage regions and the data-unwritten storage regions and outputting an information on a vacant storage region in which the control data group is unwritten externally to a monitor.

9. A method for storing a control data group, the control data group including control data specific to a control for a controlled system, into a flash memory used for a read-only memory of an electronic control unit as claimed in claim 7, which further comprises searching the data-written storage regions and the data-unwritten storage regions and outputting an information on a vacant storage region in which the control data group is un-written externally to a monitor to the effect that the vacant storage region is absent as a result of the search when no vacant storage region is present.

10. A method for storing a control data group, the control data group including control data specific to a control for a controlled system, into a flash memory used for a read-only memory of an electronic control unit as claimed in claim 9, wherein, when allocating the plurality of storage regions to the predetermined memory block of the flash memory, providing a memory location for a discrimination data indicating whether the data is written or unwritten into the corresponding storage region for each of the storage regions and wherein the searching for the vacant storage region comprises reading the discrimination data stored in the memory location of each of the storage regions to determine whether the read discrimination data indicates that the corresponding storage region is data-written or data-unwritten sequentially in the order of addresses until the address of the storage region indicates the last.

11. A method for storing a control data group, the control data group including control data specific to a control for a controlled system, into a flash memory used for a read-only memory of an electronic control unit as claimed in 10, wherein, when reading the discrimination data stored in the memory locations of all of the storage regions and determining that all of the read discrimination data indicate that the corresponding storage region is data-written, outputting the information on the vacant storage region externally to the monitor to the effect that the vacant storage region is absent.

12. A method for storing a control data group, the control data group including control data specific to a control for a controlled system, into a flash memory used for a read-only memory of an electronic control unit as claimed in claim 11, wherein the discrimination data indicates FFh when the corresponding storage region is data-unwritten and indicates 00h when the corresponding storage region is data-written.

13. A method for storing a control data group, the control data group including control data specific to a control for a controlled system, into a flash memory used for a read-only memory of an electronic control unit as claimed in 10, wherein, when reading the discrimination data stored in the memory locations of all of the storage regions and determining that the discrimination data stored in any of the storage regions indicate that the corresponding storage region is data-written and that the discrimination data in each of the remaining storage regions indicates that the corresponding storage region is data-unwritten, outputting the information on the vacant storage region externally to the monitor to the effect that the number of the written storage regions is one or more and the number of the vacant storage regions is a subtraction of the number of the data-written storage regions from a total number of the storage regions.

14. A method for storing a control data group, the control data group including control data specific to a control for a controlled system, into a flash memory used for a read-only memory of an electronic control unit as claimed in claim 13, wherein the predetermined memory block of the flash memory has a capacity of 2 kilobytes, each storage region has a memory capacity of 128 bytes, and a total of sixteen storage regions are allocated in the predetermined memory block of the flash memory, and each memory location for the discrimination data has one byte.

15. A method for storing a control data group, the control data group including control data specific to a control for a controlled system, into a flash memory used for a read-only memory of an electronic control unit as claimed in claim 4, wherein, before writing the whole control data group including the updated data into one of the storage regions which is data-unwritten and whose address is top in the order of addresses from among the remaining data-unwritten storage regions, connecting an external memory write device to the electronic control unit and determining whether the update request is issued from the connected external memory write device and wherein the writing of the whole control data group including the updated control data into the one of the storage regions which is data-unwritten and whose address is top in the order of addresses from among the remaining date-unwritten storage regions is carried out after determining that the update request is issued from the connected external memory write device.

16. A method for storing a control data group, the control data group including control data specific to a control for a controlled system, into a flash memory used for a read-only memory of an electronic control unit as claimed in claim 15, wherein the control data group includes the control data specific to the control for a vehicular component and wherein, before writing the whole control data group including the updated data into the one of the storage regions which is data-unwritten and whose address is top in the order of addresses from among the remaining data-unwritten storage regions, determining whether an ignition switch is turned from an off state to an on state and storing temporarily the whole control data including the updated control data into a RAM in the electronic control unit when determining that the ignition switch is turned from the off state to the on state and when the update request is issued from the connected external memory write device.

17. A method for storing a control data group, the control data group including control data specific to a control for a controlled system, into a flash memory used for a read-only memory of an electronic control unit as claimed in claim 16, after storing temporarily the whole control data group including the updated control data into the RAM in the electronic control unit, determining whether the ignition switch is turned from the on state to the off state and writing the whole control data group including the updated control data into the one of the storage regions which is data-unwritten and whose address is top in the order of addresses from among the remaining data-unwritten storage regions when determining that the ignition switch is turned from the on state to the off state.

18. A method for storing a control data group, the control data group including control data specific to a control for a controlled system, into a flash memory used for a read-only memory of an electronic control unit as claimed in claim 3, wherein, before writing the updated data into one of the storage regions which is data-unwritten and whose address is top in the order of addresses from among the remaining date-unwritten storage regions, connecting an external memory write device to the electronic control unit and determining whether the update request is issued from the external memory write device and wherein the writing of the updated control data into one of the storage regions which is data-unwritten and whose address is top in the order of addresses from among the remaining date-unwritten storage regions is carried out after determining that the update request is issued from the connected external memory write device.

19. A method for storing a control data group, the control data group including control data specific to a control for a controlled system, into a flash memory used for a read-only memory of an electronic control unit as claimed in claim 18, wherein the control data group includes the control data specific to the control for a vehicular component and wherein, before writing at least the updated control data into the one of the storage regions which is data-unwritten and whose address is top in the order of addresses from among the remaining data-unwritten storage regions, determining whether an ignition switch is turned from an off state to an on state and storing temporarily at least the updated control data into a RAM in the electronic control unit when determining that the ignition switch is turned from the off state to the on state and the update request is issued from the connected external memory write device.

20. A method for storing a control data group, the control data group including control data specific to a control for a controlled system, into a flash memory used for a read-only memory of an electronic control unit as claimed in claim 19, after storing temporarily the updated control data into the RAM in the electronic control unit, determining whether the ignition switch is turned from the on state to the off state and writing the updated control data into one of the storage regions which is data-unwritten and whose address is top in the order of addresses from among the remaining data-unwritten storage regions when determining that the ignition switch is turned from the on state to the off state.

21. A method for storing a control data group, the control data group including control data specific to a control for a controlled system, into a flash memory used for a read-only memory of an electronic control unit, the method comprising:

allocating a plurality of storage regions, each of the storage regions having a capacity enough for the control data group including at least one control data requiring an update of contents thereof and at least one updated control data to be written thereinto, to the predetermined memory block of the flash memory in an order of addresses;

writing the control data group including the one control data requiring the update of the contents thereof into one of the storage regions which is data-unwritten and whose address is top in the order of addresses; and writing at least the updated control data into one of the remaining storage regions which is data-unwritten and whose address is top in the order of addresses from among the remaining data-unwritten storage regions each time an update request to update the content of thereof occurs.

22. A method for storing a control data group, the control data group including control data specific to a control for a controlled system, into a flash memory used for a read-only memory of an electronic control unit as claimed in claim 21, wherein, when writing the updated control data into the one of the remaining storage regions which is data-unwritten and whose address is top in the order of addresses from among the remaining data-unwritten storage regions, writing the whole control data group including the remaining control data not updated together with the updated control data into the one of the remaining storage regions which is data-unwritten and whose address is top in the order of addresses from among the remaining data-unwritten storage regions each time the update request occurs.

23. A method for storing a control data group, the control data group including control data specific to a control for a controlled system, into a flash memory used for a read-only memory of an electronic control unit as claimed in claim 22, which further comprises reading the control data group from one of the storage regions which is data-written and whose address is last in the order of addresses from among the data-written storage regions during a use of the control data group.

24. A method for storing a control data group, the control data group including control data specific to a control for a controlled system, into a flash memory used for a read-only memory of an electronic control unit as claimed in claim 23, wherein, when allocating the plurality of storage regions to the predetermined memory block of the flash memory, providing a memory location for a discrimination data indicating whether the data is written or unwritten into the corresponding storage region for each of the storage regions and wherein, before reading the control data group from the one of the storage regions which is data written and whose address is last in the order of addresses from among the data-written storage regions, reading the discrimination data from the corresponding memory location to determine whether the storage region in which the read discrimination data is stored is the storage region from which the control data group is to be read.

25. An apparatus for storing a control data group, the control data group including control data specific to a control for a controlled system, into a flash memory used for a read-only memory of an electronic control unit, the apparatus comprising:

storage region allocating section that allocates a plurality of storage regions, each of the storage regions having a capacity enough for the control data group including at least one control data requiring an update of contents thereof and at least one updated control data to be written thereinto, to the predetermined memory block of the flash memory in an order of addresses;

a control data group writing section that writes the control data group including the control data requiring the update of contents thereof into the one of the storage regions which is data-unwritten and whose address is top in the order of addresses; and an updated data write processing section that writes at least the updated control data into one of the storage regions which is data-unwritten and whose address is top in the order of addresses from among the remaining data-unwritten storage regions each time the update request occurs.

26. An apparatus for storing a control data group, the control data group including control data specific to a control for a controlled system, into a flash memory used for a read-only memory of an electronic control unit as claimed in claim 25, wherein, when writing the updated control data into the one of the remaining storage regions which is data-unwritten and whose address is top in the order of addresses from among the remaining data-unwritten storage regions, the updated control data write processing section writes the whole control data group including the remaining control data not updated together with the updated control data into one of the remaining storage regions which is data-unwritten and whose address is top in the order of addresses from among the remaining data-unwritten storage regions each time the update request is issued from the memory write device.

27. An apparatus for storing a control data group, the control data group including control data specific to a control for a controlled system, into a flash memory used for a read-only memory of an electronic control unit as claimed in claim 26, which further comprises a control data group read processing section that reads the control data group from one of the storage regions which is data-written and whose address is last in the order of addresses from among the data-written storage regions during a use of the control data group.

28. An apparatus for storing a control data group, the control data group including control data specific to a control for a controlled system, into a flash memory used for a read-only memory of an electronic control unit as claimed in claim 27, wherein each of the storage regions is provided with a memory location for a discrimination data indicating whether the data is written or unwritten and before reading the whole control data group, the control data group read processing section reads the discrimination data of each of the storage regions to determine which of the storage regions is last in the order of addresses to be read from among the data-written storage regions.

29. An apparatus for storing a control data group, the control data group including control data specific to a control for a controlled system, into a flash memory used for a read-only memory of an electronic control unit as claimed in claim 28, wherein, before writing the whole control data group including the updated control data and the remaining control data not updated into one of the storage regions which is data-unwritten and whose address is top in the order of addresses from among the remaining data-unwritten storage regions, the updated control data write processing section reads the discrimination data stored in each of the memory locations to determine which of the storage regions is top in the order of addresses to be written from among the remaining data-unwritten storage regions.

30. An apparatus for storing a control data group, the control data group including control data specific to a control for a controlled system, into a flash memory used for a read-only memory of an electronic control unit as claimed in claim 28, wherein the control data group includes the control data specific to the control for a vehicular component, wherein the control data group includes a calibration verification value to be calculated on the basis of all data within the flash memory to diagnose the flash memory, and wherein, each time the control data requiring the update of the contents thereof is updated, the calibration verification value is updated.

31. An apparatus for storing a control data group, the control data group including control data specific to a control for a controlled system, into a flash memory used for a read-only memory of an electronic control unit as claimed in claim 30, which further comprises a searching section that searches the data-written storage regions and the data-unwritten storage regions from a state of the discrimination data in the memory location of each of the storage regions and outputs an information on a vacant storage region in which the data is unwritten to a monitor.

32. An apparatus for storing a control data group, the control data group including control data specific to a control for a controlled system, into a flash memory used for a read-only memory of an electronic control unit as claimed in claim 30, wherein the updated control data write processing section comprises a searching section that searches the data-written storage regions and the data-unwritten storage regions and outputs an information on a vacant storage region in which the control data group is unwritten externally to a monitor to the effect that the vacant storage region is absent.

33. An apparatus for storing a control data group, the control data group including control data specific to a control for a controlled system, into a flash memory used for a read-only memory of an electronic control unit as claimed in claim 32, which further comprises: a second determinator to determine whether an ignition switch is turned from an off state to an on state; a RAM into which at least the updated control data is temporarily stored when the second determinator determines that the ignition switch is turned from the off state to the on state and wherein the updated control data writing processor writes at least the updated control data into one of the storage regions which is data-unwritten and whose address is top in the order of addresses from among the remaining data-unwritten storage regions after at least the updated control data is temporarily stored into the RAM.

34. An apparatus for storing a control data group, the control data group including control data specific to a control for a controlled system, into a flash memory used for a read-only memory of an electronic control unit as claimed in claim 33, wherein, after the updated control data write processing section stores temporarily the updated control data into the RAM, the second determinator determines whether the ignition switch is turned from the on state to the off state and wherein the updated control data write processing section writes the updated control data into one of the storage regions which is data-unwritten and whose address is top in the order of addresses from among the remaining data-unwritten storage regions when the second determinator determines that the ignition switch is turned from the on state to the off state.

35. An apparatus for storing a control data group, the control data group including control data specific to a control for a controlled system, into a flash memory used for a read-only memory of an electronic control unit as claimed in claim 32, which further comprises: a second determinator to determine whether an ignition switch is turned from an off state to an on state; a RAM into which the whole control data group including the updated control and the remaining control data not updated is temporarily stored when the second determinator determines that the ignition switch is turned from the off state to the on state and wherein the updated control data write processing section writes the whole control data group into one of the storage regions which is data-unwritten and whose address is top in the order of addresses from among the remaining data-unwritten storage regions after at least the updated control data is temporarily stored into the RAM.

36. An apparatus for storing a control data group, the control data group including control data specific to a control for a controlled system, into a flash memory used for a read-only memory of an electronic control unit as claimed in claim 35, wherein, after the updated control data write processing section stores temporarily the whole control data group including the updated control data and the remaining control data not updated into the RAM, the second determinator determines whether the ignition switch is turned from the on state to the off state and wherein the updated control data write processing section writes the whole control data group into one of the storage regions which is data-unwritten and whose address is top in the order of addresses from among the remaining data-unwritten storage regions when the second determinator determines that the ignition switch is turned from the on state to the off state.

37. An electronic control unit comprising:
 a flash memory having a predetermined memory block to which a plurality of storage regions are allocated in an order of addresses, each of the storage regions having a capacity enough for a control data group including control data specific to a control for a controlled system to be written and the control data group including at least one control data requiring an update of contents thereof being written into one of the storage regions which is data-unwritten and whose address is top in the order of addresses;
 a first determinator to determine whether an update request to update the contents of the control data requiring the update is issued from a memory write device external to the electronic control unit; and
 an updated control data writing processor to write at least updated control data into one of the remaining storage regions which is data-unwritten and whose address is top in the order of addresses from among the remaining data-unwritten storage regions each time the determinator determines that the update request is issued.

38. An electronic control unit as claimed in claim 37, wherein, when writing the updated control data into the one of the remaining storage regions which is data-unwritten and whose address is top in the order of addresses from among the remaining data-unwritten storage regions, the updated control data writing processor writes the whole control data group including the remaining control data not updated together with the updated control data into the one of the remaining storage regions which is data-unwritten and whose address is top in the order of addresses from among the remaining data-unwritten storage regions each time the update request is issued from the memory write device.

39. An electronic control unit as claimed in claim 38, which further comprises a control data group read processor that reads the control data group from one of the storage regions which is data-written and whose address is last in the order of addresses from among the data-written storage regions during a use of the control data group.

40. An electronic control unit as claimed in claim 39, wherein each of the storage regions is provided with a memory location for a discrimination data indicating whether the data is written or unwritten and before reading the whole control data group, the control data group read processor reads the discrimination data of each of the storage regions to determine which of the storage regions is the last address in the order of addresses to be read from among the data-written storage regions.

41. An electronic control unit as claimed in claim 40, wherein before writing the whole control data group including the updated control data and the remaining control data not updated into the one of the storage regions which is data-unwritten and whose address is top in the order of addresses from among the remaining data-unwritten storage regions, the updated control data writing processor reads the discrimination data stored in each of the memory locations to determine which of the storage regions is top in the order of addresses to be written from among the remaining data-unwritten storage regions.

42. An electronic control unit as claimed in claim 40, wherein the control data group includes the control data specific to the control for a vehicular component, wherein the control data group includes a calibration verification value (CVN) to be calculated on the basis of all data within the flash memory to diagnose the flash memory, and wherein, each time the control data requiring the update of the contents thereof is updated, the calibration verification value is updated.

43. An electronic control unit as claimed in claim 42, which further comprises a searching section that searches the data-written storage regions and the data-unwritten storage regions from a state of the discrimination data in the memory location of each of the storage regions and outputs an information on a vacant storage region in which the data is unwritten to a monitor.

44. An electronic control unit as claimed in claim 42, wherein the updated control data writing processor comprises a searching section that searches the data-written storage regions and the data-unwritten storage regions and outputs an information on a vacant storage region in which the control data group is unwritten externally to a monitor to the effect that the vacant storage region is absent.

45. An electronic control unit as claimed in claim 44, which further comprises: a second determinator to determine whether an ignition switch is turned from an off state to an on state; and a RAM into which at least the updated control data is temporarily stored when the second determinator determines that the ignition switch is turned from the off state to the on state and wherein the updated control data writing processor writes at least the updated control data into one of the storage regions which is data-unwritten and whose address is top in the order of addresses from among the remaining data-unwritten storage regions after at least the updated control data is temporarily stored into the RAM.

46. An electronic control unit as claimed in claim 45, wherein, after the updated control data writing processor stores temporarily the updated control data into the RAM, the second determinator determines whether the ignition switch is turned from the on state to the off state and wherein the updated control data writing processor writes the updated control data into one of the storage regions which is data-unwritten and whose address is top in the order of addresses from among the remaining data-unwritten storage regions when the second determinator determines that the ignition switch is turned from the on state to the off state.

47. An electronic control unit as claimed in claim 44, which further comprises: a second determinator to determine whether an ignition switch is turned from an off state to an on state; and a RAM into which the whole control data group including the updated control and the remaining control data not updated is temporarily stored when the second determinator determines that the ignition switch is turned from the off state to the on state and wherein the updated control data writing processor writes the whole control data group into one of the storage regions which is data-unwritten and whose address is top in the order of addresses from among the remaining data-unwritten storage regions after at least the updated control data is temporarily stored into the RAM.

48. An electronic control unit as claimed in claim 47, wherein, after the updated control data writing processor stores temporarily the whole control data group including the updated control data and the remaining control data not updated into the RAM, the second determinator determines whether the ignition switch is turned from the on state to the off state and wherein the updated control data writing processor writes the whole control data group into one of the storage regions which is data-unwritten and whose address is top in the order of addresses from among the remaining data-unwritten storage regions when the second determinator determines that the ignition switch is turned from the on state to the off state.

49. An apparatus for storing a control data group, the control data group including control data specific to a control for a controlled system, into a flash memory used for a read-only memory of an electronic control unit, the apparatus comprising:
  storage region allocating means for allocating a plurality of storage regions, each of the storage regions having a capacity enough for the control data group including at least one control data requiring an update of contents thereof and at least one updated control data to be written thereinto, to the predetermined memory block of the flash memory in an order of addresses;
  control data group write processing means for writing the control data group including the control data requiring the update of contents thereof into the one of the storage regions which is data-unwritten and whose address is top in the order of addresses; and
  updated data write processing means for writing at least the updated control data into one of the storage regions which is data-unwritten and whose address is top in the order of addresses from among the remaining data-unwritten storage regions each time the update request occurs.

* * * * *